United States Patent
Matsueda

(10) Patent No.: US 6,845,016 B2
(45) Date of Patent: Jan. 18, 2005

(54) ELECTRONIC DEVICE AND METHOD OF MANUFACTURING THE SAME, AND ELECTRONIC INSTRUMENT

(75) Inventor: Yojiro Matsueda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 173 days.

(21) Appl. No.: 10/241,588

(22) Filed: Sep. 12, 2002

(65) Prior Publication Data

US 2003/0072141 A1 Apr. 17, 2003

(30) Foreign Application Priority Data

Sep. 13, 2001 (JP) ........................................ 2001-278628

(51) Int. Cl.⁷ .............................................. H01R 9/00
(52) U.S. Cl. .......................... 361/772; 361/795; 349/153
(58) Field of Search ................................. 361/772–774, 361/795; 174/250, 261; 349/149–158

(56) References Cited

U.S. PATENT DOCUMENTS 5,929,948 A * 7/1999 Ohori et al. .................. 349/44
5,965,981 A * 10/1999 Inoguchi et al. ............ 313/506
6,720,944 B1 * 4/2004 Ishii et al. ..................... 345/87

FOREIGN PATENT DOCUMENTS

| JP | A 11-7039 | 1/1999 |
| JP | A 11-7047 | 1/1999 |
| JP | A 11-109403 | 4/1999 |
| JP | A 11-352516 | 12/1999 |
| JP | A 2000-357584 | 12/2000 |
| JP | A 2001-109398 | 4/2001 |

* cited by examiner

Primary Examiner—Kamand Cuneo
Assistant Examiner—Tuan Dinh
(74) Attorney, Agent, or Firm—Oliff & Berridge, PLC

(57) ABSTRACT

An electronic device includes: a substrate; a plurality of operating elements provided in an operating region of the substrate; a first wiring pattern which is provided outside the operating region in the substrate so that the first wiring pattern has the width longer than the operating region; a first electrode formed in a layer different from the first wiring pattern, partially overlapping the first wiring pattern, and supplying common electrical energy to the operating elements; and a conductive section provided in a region in which the first wiring pattern partially overlaps the first electrode, electrically connecting the first wiring pattern to the first electrode.

21 Claims, 6 Drawing Sheets

ELECTRONIC DEVICE AND METHOD OF MANUFACTURING THE SAME, AND ELECTRONIC INSTRUMENT

Japanese Patent Application No. 2001-278628, filed on Sep. 13, 2001, is hereby incorporated by reference in its entirety.

BACKGROUND OF THE INVENTION

The present invention relates to an electronic device and a method of manufacturing the same, and an electronic instrument.

A liquid crystal panel is an example of an electronic device having a pair of electrodes opposing to each other. In the liquid crystal panel, voltage is applied between a first electrode and a second electrode. External terminals are formed on a substrate on which the first electrode is formed. The second electrode is electrically connected with some of the external terminals formed on the substrate. In more detail, conductive sections protrude from the substrate, and wiring from the external terminals and the second electrode are electrically connected via the conductive sections. The conductive sections are locally disposed only at corner areas of the liquid crystal panel. Therefore, since the conductive sections are small, a problem of high conductive resistance occurs. However, in a conventional liquid crystal panel, larger conductive sections cannot be provided because of tight routing of wiring on the substrate.

BRIEF SUMMARY OF THE INVENTION

An electronic device according to the present invention comprises:
  a substrate;
  a plurality of operating elements provided on the substrate and defining an operating region;
  a first wiring pattern which is provided outside the operating region and within the substrate and is longer than the width of the operating region;
  a first electrode provided in a layer different from the first wiring pattern, partially overlapping the first wiring pattern, for supplying electrical energy commonly to the operating elements; and
  a conductive section, provided in a region in which the first wiring pattern partially overlaps the first electrode, for electrically connecting the first wiring pattern with the first electrode.

An electronic instrument according to the present invention comprises the above electronic device.

A method of manufacturing an electronic device according to the present invention comprises:
  forming a plurality of operating elements on a substrate, the plurality of operating elements defining an operating region;
  forming a first wiring pattern outside the operating region and within the substrate, the first wiring pattern longer than the width of the operating region;
  forming a conductive section on the first wiring pattern; and
  forming a first electrode for supplying electrical energy commonly to the operating elements in a layer different from the first wiring pattern so that the first electrode covers the conductive section and partially overlaps the first wiring pattern.

DETAILED DESCRIPTION OF THE EMBODIMENTS

Figure 1:
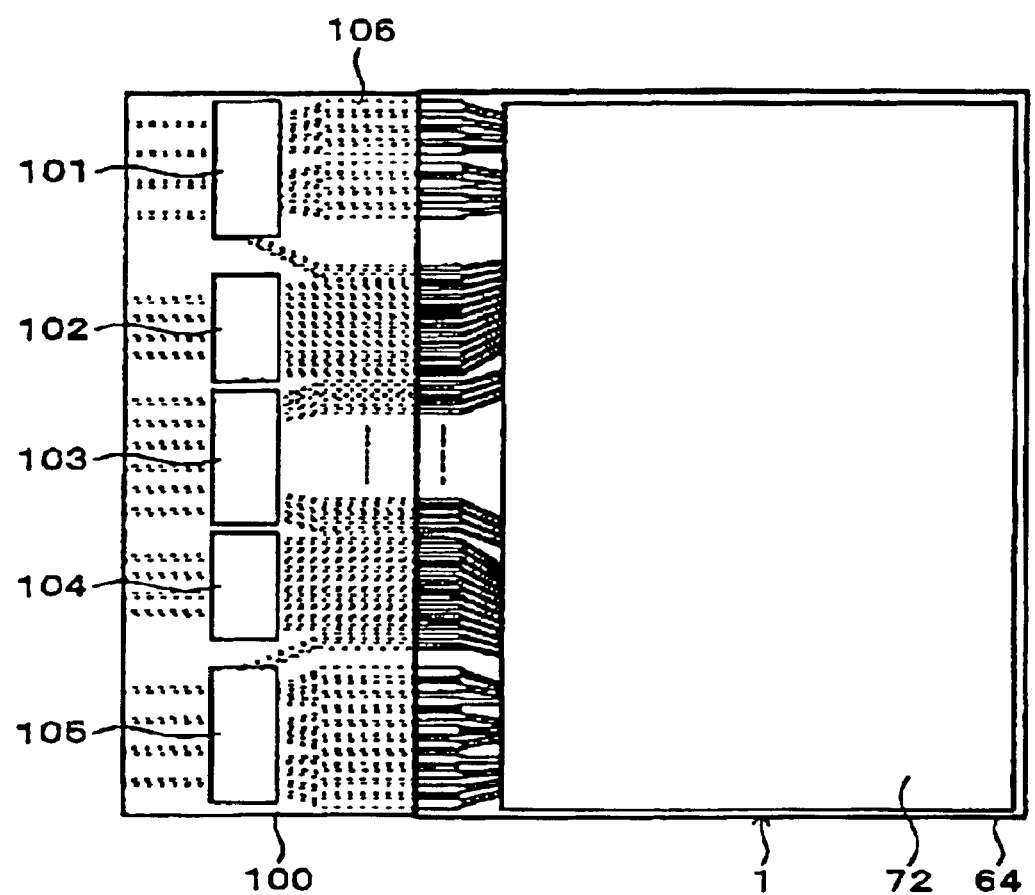
FIG. 1 is a plan view of the electronic device according to one embodiment of the present invention.

The present invention may provide an electronic device in which electrical connection to an electrode can be achieved with reduced resistance, a method of manufacturing such an electronic-device, and an electronic instrument.

(1) An electronic device according to one embodiment of the present invention comprises:
  a substrate;
  a plurality of operating elements provided on the substrate and defining an operating region;
  a first wiring pattern which is provided outside the operating region and within the substrate and is longer than the width of the operating region;
  a first electrode provided in a layer different from the first wiring pattern, partially overlapping the first wiring pattern, for supplying electrical energy commonly to the operating elements; and
  a conductive section, provided in a region in which the first wiring pattern partially overlaps the first electrode, for electrically connecting the first wiring pattern with the first electrode.

According to this embodiment of the present invention, a large conductive section can be formed. Therefore, the first wiring pattern can be electrically connected with the first electrode with reduced resistance by forming the first wiring pattern longer than at least the width of the operating region. If the operating region is rectangular or square, the width of the operating region may be the length of one side of the operating region. If the operating region is circular, the width of the operating region may be the diameter of the operating region.

(2) The electronic device may further comprise:
  a plurality of second electrodes provided in accordance with the operating elements to supply the electrical energy to the operating elements;
  a plurality of driver circuits electrically connected with the second electrodes to drive the operating elements; and
  a second wiring pattern provided between the operating region and the first wiring pattern, and electrically connected to the driver circuit.

(3) In this electronic device, the first electrode may face the second electrodes, at least part of the operating elements being interposed between the first and the second electrodes.

(4) In this electronic device,
  the first wiring pattern may surround the operating region with an opening through which a third wiring pattern electrically connected to the operating elements is provided.

(5) An electronic circuit for supplying a signal to the driver circuits may be provided between the operating region and the first wiring pattern.

(6) In this electronic device,
the first wiring pattern may surround the operating region and the electronic circuit with on opening through which a third wiring pattern electrically connected to the operating elements is provided.

(7) In this electronic device,
the electronic circuit may include a scanning line driver, and the third wiring pattern may include an wiring pattern which supplies a data signal to the driver circuits.

(8) The electronic device may further comprise:
a plurality of terminals provided in an end portion of the substrate to which the first, second, and third wiring patterns are electrically connected,
wherein a first group of the terminals to which the first and second wiring patterns are electrically connected is formed at a pitch larger than a pitch of a second group of the terminals to which the third wiring pattern is electrically connected.

(9) The electronic device may further comprise:
a plurality of terminals provided in an end portion of the substrate to which the first, second, and third wiring patterns are electrically connected,
wherein a first group of the terminals to which the first and second wiring patterns are electrically connected is formed at a pitch larger than a pitch of a second group of the terminals to which the third wiring pattern is electrically connected.

(10) The electronic device may further comprise:
an insulating layer provided in a region between the first wiring pattern and the first electrode but except the conductive section.

(11) In this electronic device, the second wiring pattern may include a plurality of split wiring patterns which are separated from each other.

(12) In this electronic device,
each of the operating elements may have one of light-emitting materials which emit different colors of light from each other, and the split wiring patterns may be provided in accordance with the colors of light.

(13) In this electronic device,
part of at least one of the split wiring patterns and part of the other split wiring patterns may be disposed on the opposite sides of the operating region.

(14) In this electronic device,
at least two of the split wiring patterns may have portions which are adjacent to each other between the operating region and an edge portion of the substrate; and
at least the portions of the split wiring patterns adjacent to each other may have different widths.

(15) In this electronic device, at least one of the split wiring patterns may have a first section which is adjacent to another one of the split wiring patterns between the operating region and an edge portion of the substrate, and a second section which is wider than the first section.

(16) In this electronic device,
the substrate may have a plurality of sides and terminals are provided in a region near one of the sides.

(17) An electronic instrument according to one embodiment of the present invention comprises the above electronic device.

(18) A method of manufacturing an electronic device according to one embodiment of the present invention comprises:
forming a plurality of operating elements in an operating region of a substrate;
forming a first wiring pattern outside the operating region in the substrate, the first wiring pattern being longer than the width of the operating region;
forming a conductive section on the first wiring pattern; and
forming a first electrode for supplying common electrical energy to the operating elements in a layer different from the first wiring pattern so that the first electrode covers the conductive section and partially overlaps the first wiring pattern.

According to this embodiment of the present invention, a large conductive section can be formed. Therefore, the first wiring pattern can be electrically connected with the first electrode while reducing the resistance by forming the first wiring pattern having the length larger than at least the width of the operating region. If the operating region is rectangular or square, the width of the operating region may be the length of one side of the operating region. If the operating region is circular, the width of the operating region may be the diameter of the operating region.

(19) This method of manufacturing an electronic device may further comprise:
forming second electrodes in accordance with the operating elements to supply the electrical energy to the operating elements;
forming driver circuits for driving the operating elements to be electrically connected to the second electrodes; and
forming a second wiring pattern between the operating region and the first wiring pattern to be electrically connected to the driver circuits.

(20) In this method of manufacturing an electronic device, one of a plurality of light-emitting materials which emit different colors of light from each other may be provided to each of the operating elements; and
a plurality of split wiring patterns which are separated from each other may be provided in accordance with the colors of light.

(21) In this method of manufacturing an electronic device, at least two of the split wiring patterns may have, portions which are adjacent to each other between the operating region and an edge portion of the substrate; and
at least the portions of the split wiring patterns adjacent to each other may have different widths from each other.

Embodiments of the present invention are described below with reference to the drawings.

Figure 2:
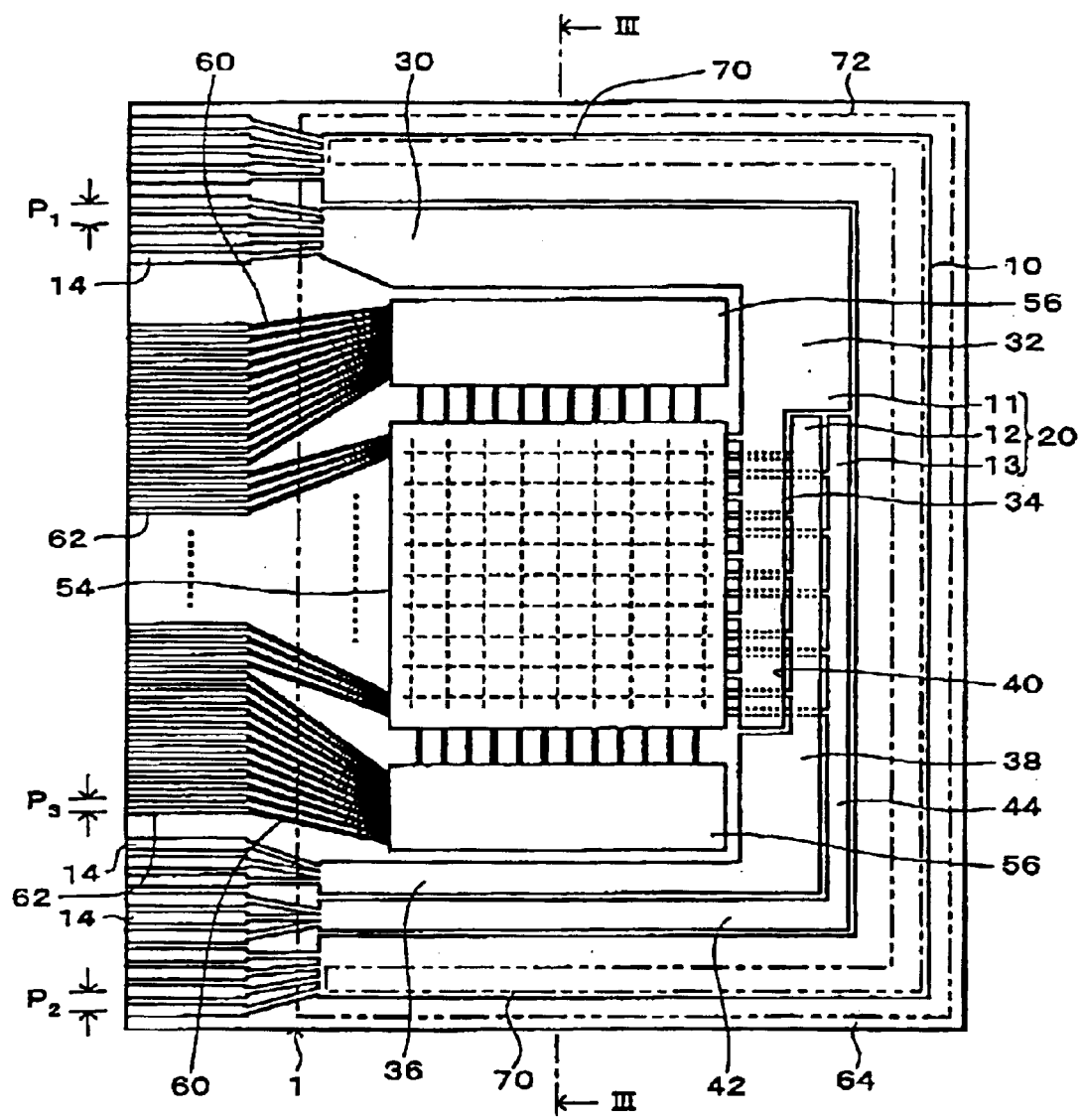
FIG. 2 is a plan view of details of the electronic device according to the embodiment illustrated in FIG. 1.
Figure 3:
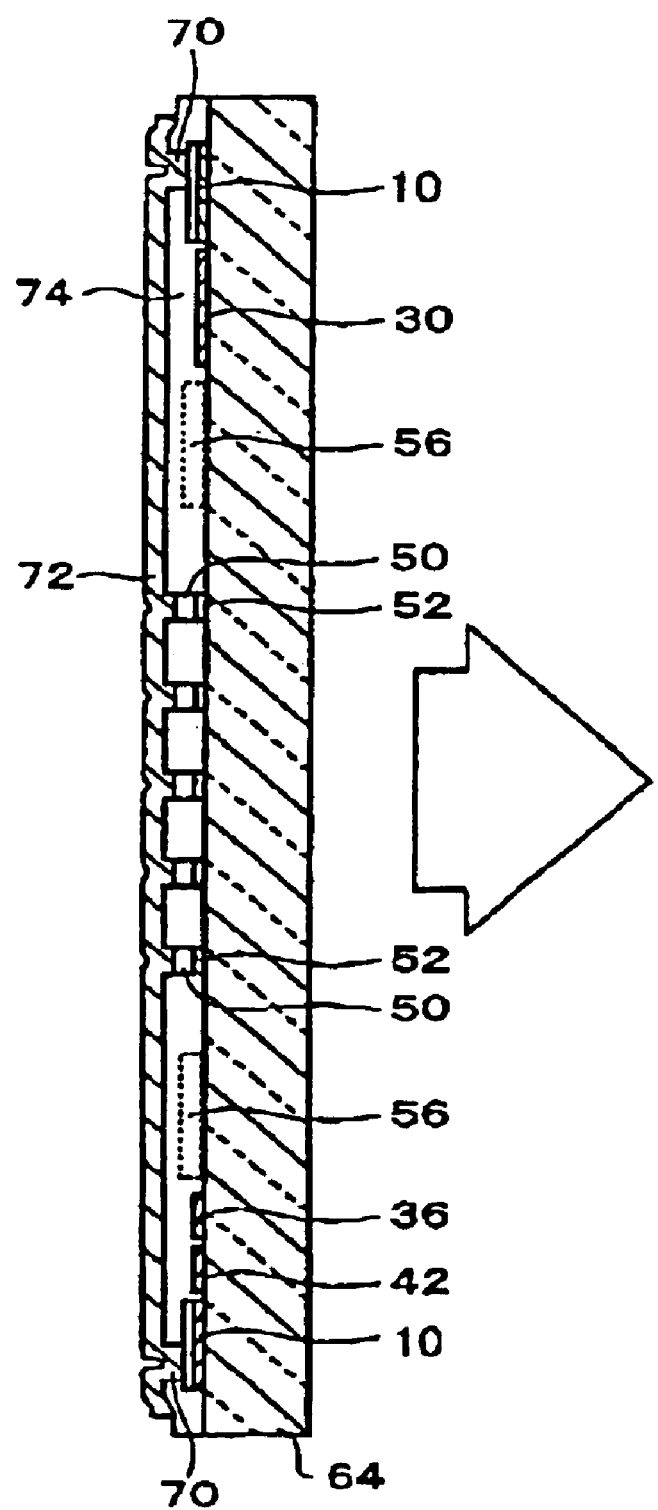
FIG. 3 is a cross-sectional view taken along the line III—III of FIG. 2.

FIG. 1 is a view illustrating an electronic device according to one embodiment of the present invention. An electronic device 1 may be an electro-optical device such as a display (a display panel, for example) or a storage. The electronic device 1 shown in FIG. 1 is an organic EL (electroluminescent) panel. FIG. 2 is a view showing details of the electronic device 1. FIG. 3 is a cross-sectional view taken along the line III—III shown in FIG. 2. The electronic device 1 includes first and second wiring patterns 10 and 20. The first wiring pattern 10 is located outside the second wiring pattern 20 in the electronic device 1.

The second wiring pattern 20 is provided between an operating region 54 and the first wiring pattern 10. The second wiring pattern 20 consists of a plurality of (three or more, for example (first to third in the example shown in FIG. 2)) split wiring patterns 11 to 13. The first to third split wiring patterns 11 to 13 are separated from each other. The first split wiring pattern 11 is formed at a position apart from the split wiring patterns 12 and 13 (at the side of the operating region 54 opposite to the second and third split wiring patterns 12 and 13 in which a plurality of operating elements 50 are formed, for example). The split wiring patterns other than the first split wiring pattern 11 (second and third split wiring patterns 12 and 13) are disposed adjacent to each other. Part of at least one split wiring pattern (first split wiring pattern 11, for example) and part of other split wiring patterns (second and third split wiring patterns 12 and 13, for example) are disposed on the opposite sides of the operating region 54. At least two split wiring patterns (the second and third split wiring patterns 12 and 13, for example) may be partially adjacent to each other between the operating region 54 and an edge of the substrate 64, and at least the adjacent parts have different widths. At least one of the split wiring patterns (the first split wiring pattern 11, for example) may have a first section which is adjacent to another one of the other split wiring patterns (second split wiring pattern 12, for example) between the operating region 54 and an edge of the substrate 64, and a second section which has the width larger than the first section.

The second wiring pattern 20 has a plurality of terminals 14. In this embodiment, the terminals 14 are ends of the split wiring patterns 11 to 13. Each of the split wiring patterns 11 to 13 is connected with at least one (two or more in FIG. 2) terminal 14. The terminals 14 are arranged in the widthwise direction. The terminals 14 are arranged so that the tips are uniformly positioned. The second wiring pattern 20 is pulled out to one side of the substrate 64.

The second wiring pattern 20 has a first section extending from the terminals 14, and a second section extending in a direction which intersects the direction in which the first section extends. For example, the first split wiring pattern 11 has a first section 30 extending from the terminals 14, and a second section 32 extending in a direction which intersects the direction in which the first section 30 extends (at right angles in FIG. 2). The first and second sections 30 and 32 form an L-shape. In more detail, the first section 30 extends in a direction perpendicular (or substantially perpendicular) to a line (an edge line of the substrate 64, for example) along which tips of the terminals 14 are arranged. The second section 32 extends in a direction parallel (or substantially parallel) to that line (an edge line of the substrate 64, for example) along which tips of the terminals 14 are arranged. A cut portion 34 is formed in the second section 32 so as to avoid at least one of the second and third split wiring patterns 12 and 13 (both in FIG. 2). The cut portion 34 is formed to reduce the width of the second section 32 (or a length in a direction perpendicular to the extending direction of the second section 32). The cut portion 34 shown in FIG. 2 is formed on the far side of the second section 32 from the first section 30 (or the outside of the L-shape formed of the first and second sections 30 and 32, for example). As a modification example, the cut portion 34 may be formed on the near side of the second section 32 from the first section 30 is formed (or the inside of the L-shape formed of the first and second sections 30 and 32, for example).

The second split wiring pattern 12 has a first section 36 extending from the terminals 14, and a second section 38 extending in a direction intersecting the first section 36 (at right angles in FIG. 2). The first and second sections 36 and 38 form an L-shape. In more detail, the first section 36 extends in a direction perpendicular (or substantially perpendicular) to a line (or an edge line of the substrate 64, for example) along which tips of the terminals 14 are arranged. The second section 38 extends in a direction parallel (or substantially parallel) to a line (or an edge line of the substrate 64, for example) along which tips of the terminals 14 are arranged. A cut portion 40 is formed in the second section 38 so as to avoid at least one of the first and third split wiring patterns 11 and 13 (the first split wiring pattern 11 in FIG. 2). The cut portion 40 is formed to reduce the width of the second section 38 (or a length in a direction perpendicular to the extending direction of the second section 38). The cut portion 40 shown in FIG. 2 is formed on the near side of the second section 38 from the first section 36 (or the inside of the L-shape formed of the first and second sections 36 and 38, for example). As a modification example, the cut portion 40 may be formed on the far side of the second section 38 from the first section 36 (or the inside of the L-shape formed of the first and second sections 36 and 38, for example).

The third split wiring pattern 13 has a first section 42 extending from the terminals 14, and a second section 44 extending in a direction intersecting the first section 42 extends (at right angles in FIG. 2). The first and second sections 42 and 44 form an L-shape. In more detail, the first section 42 extends in a direction perpendicular (or substantially perpendicular) to a line (or an edge line of the substrate 64, for example) along which tips of the terminals 14 are arranged. The second section 44 extends in a direction parallel (or substantially parallel) to a line (or an edge line of the substrate 64, for example) along which tips of the terminals 14 are arranged. As a modification example, a cut portion may be formed in the second section 44 so as to avoid at least one of the first and second split wiring patterns 11 and 12. The details of the cut portion are the same as the above-described cut portions 34 and 40.

In this embodiment, the first section 30 of the first split wiring pattern 11 and the first sections 36 and 42 of the second and third split wiring patterns 12 and 13 are disposed on opposite sides of the operating region 54 in which the operating elements 50 are formed. The second section 32 of the first split wiring pattern 11 and the second sections 38 and 44 of the second and third split wiring patterns 12 and 13 extend in opposite directions respectively from the first section 30 and the first sections 36 and 42. The second section 32 of the first split wiring pattern 11 and the second sections 38 and 44 of the second and third split wiring patterns 12 and 13 are at least partially adjacent to each other. The second wiring pattern 20 forms a C-shape. In more detail, the first to third split wiring patterns 11 to 13 surround a region (the operating region 54, for example) from three directions. The first to third split wiring patterns 11 to 13 surround the region with at least one side of the region (or one side of the substrate 64, for example) remained not to be surrounded. For example, the first to third split wiring patterns 11 to 13 surround three sides of a quadrilateral region, but leave it open on one side.

The first split wiring pattern 11 is formed to be wider than the second and third split wiring patterns 12 and 13. The width used herein refers to the lengths of the first to third split wiring patterns 11 to 13 in a direction perpendicular to the extending direction of the first to third split wiring patterns 11 to 13. The width of the first section 30 of the first split wiring pattern 11 is greater than the widths of the first sections 36 and 42 of the second and third split wiring patterns 12 and 13. The width of at least part of the second section 32 of the first split wiring pattern 11 is greater than the widths of the second sections 38 and 44 of the second and third split wiring patterns 12 and 13. In the example shown in FIG. 1, the width of the second section 32 of the first split wiring pattern 11 in the area in which the cut portion 34 is formed is smaller than the second section 38 of the second split wiring pattern 12 in the area in which the cut portion 40 is not formed.

The second wiring pattern 20 is electrically connected with second electrodes 52 (see FIG. 3). The second electrodes 52 consist of a plurality of electrodes. Each of the second electrodes 52 is provided corresponding to each of the operating elements 50. The second electrodes 52 supply electrical energy to each of the operating elements 50. At least a part (only a part in many cases) of the second electrode 52 is formed to overlap the operating elements 50. In this embodiment, the second electrodes 52 are formed by transparent electrodes made of ITO (indium tin oxide) so that the second electrodes 52 transmit light, for example. The second electrodes 52 may be formed in the shape of a matrix. The second electrodes 52 are formed in the region surrounded by the second wiring pattern 20. In the example shown in FIG. 2, the second electrodes 52 are disposed on one side (side opened by the second wiring pattern 20 (left side in FIG. 2)) of the second sections 32, 38, and 44 of the first to third split wiring patterns 11 to 13. Multilayer wiring patterns may be used to electrically connect the second sections 32, 38, and 44 of the first to third split wiring patterns 11 to 13 with the second electrodes 52.

The first wiring pattern 10 and the operating region 54 or the second electrodes 52 are disposed on the opposite sides of the second wiring pattern 20. The first wiring pattern 10 is formed to have a length larger than the width of the operating region 54. Therefore, since the first wiring pattern 10 is provided outside the operating region 54, a conductive section 70 can be made to have a sufficient length. In the case where the operating region 54 is rectangular (or square), the width of the operating region 54 may be the length of one side. In the case where the operating region 54 is polygonal, the width of the operating region 54 may be the length of the diagonal. In the case where the operating region 54 is circular, the width of the operating region 54 may be the diameter (major axis or minor axis if the operating region 54 is oval). The first wiring pattern 10 is provided outside the operating region 54 in the substrate 64. The first wiring pattern 10 is formed to have a length at least equal to the length of one side of the operating region 54. The first wiring pattern 10 forms a C-shape, in more detail, the first wiring pattern 10 surrounds a region (or the operating region 54, for example) from three directions. The first wiring pattern 10 surrounds the operating region 54 except part of the surrounding area in which a third wiring pattern 60 is formed. The first wiring pattern 10 opens in at least one direction. For example, the first wiring pattern 10 surrounds three sides of a quadrilateral region, but leaves it open on one side. The first and second wiring patterns 10 and 20 open in the same direction. As shown in FIG. 3, the first wiring pattern 10 may be formed by a plurality of layers.

An optical device (electro-optical device) may be formed by providing an optical material (light-emitting material, liquid crystal, or the like) to the operating elements 50. Electro-optical elements may be formed by using an optical material. In this case, the operating region 54 may be a display region (display section). The shape of the operating region 54 is not limited to a rectangle (or square). The operating region 54 may be polygonal other, than rectangular, circular, or oval. Each of the operating elements 50 has one of light-emitting materials which emit different colors of light. The split wiring patterns 11 to 13 are provided according to colors of light. In the electronic device 1 as an organic EL panel, light-emitting materials of red, green, and blue may be provided to the operating elements 50. A hole transport layer and an electron transport layer may be formed in the operating elements 50. As described above, since the first split wiring pattern 11 is wider than the second and third split wiring patterns 12 and 13, the first split wiring pattern 11 may be provided for a material exhibiting poor light-emitting efficiency (or a polymer material such as a blue light-emitting material). This enables a heavy current (or a stable current) to be supplied from the wide first split wiring pattern 11. In this case, the second and third split wiring patterns 12 and 13 are provided for low-molecular-weight materials (such as red and green light-emitting materials).

The electronic device 1 includes an electronic circuit 56. The electronic circuit 56 controls the operation (emission of light in the organic EL panel) of the operating elements 50. The electronic circuit 56 may supply signals to a driver circuit for driving the operating elements 50 (circuit including drive elements 120, for example). The electronic circuit 56 may include a scanning line driver for the display section. The electronic circuit 56 is electrically connected with the second electrodes 52. The electronic circuit 56 is provided between the second wiring pattern 20 and the operating region 54. In more detail, the electronic circuit 56 is provided between the first section 30 of the first split wiring pattern 11 (or the first sections 36 and 42 of the second and third split wiring patterns 12 and 13) and the operating region 54. TFTs (thin film transistors) may be part of the electronic circuit 56. The electronic circuit 56 is formed between the operating region 54 and the first wiring pattern 10.

At least one (two or more in many cases) third wiring pattern 60 is pulled out in a direction in which the first wiring pattern 10 or the second wiring pattern 20 opens (left direction in FIG. 2). The third wiring pattern 60 is electrically connected with the operating elements 50. The third wiring pattern 60 is pulled out from at least one of the second electrodes 52 and the electronic circuit 56 (both in the example shown in FIG. 2). A plurality of the third wiring patterns 60 include wiring patterns for supplying data signals to the driver circuit for driving the operating elements 50 (circuit including the drive elements 120, for example). The wiring patterns pulled out from the operating region 54 (second electrodes 52) among the third wiring patterns 60 may supply the data signals to the display section. The third wiring patterns 60 have terminals 62. A plurality of the terminals 62 of a plurality of the third wiring patterns 60 are arranged in the widthwise direction. A plurality of the terminals 62 are arranged so that the tips are uniformly positioned. The third wiring patterns 60 are pulled out toward one side of the substrate 64. Pitches $P_1$ and $P_2$ of a plurality of the terminals 14 of the first and second wiring patterns 10 and 20 are greater than a pitch $P_3$ of a plurality of the terminals 62 of the third wiring patterns 60. The width of a plurality of the terminals 14 of the first and second wiring patterns 10 and 20 is greater than the width of a plurality of the terminals 62 of the third wiring patterns 60. The terminals 14 and 62 are formed at the edge of the substrate 64. The substrate 64 has a plurality of sides. The terminals 14 and 62 are formed in the area located on one side (edge which forms one side).

The first and second wiring patterns 10 and 20 are formed on the substrate 64 as a support member. The substrate 64 has light transmissibility. The substrate 64 is a glass substrate, for example. The electronic circuit 56 may be formed on the substrate 64. The second electrodes 52 may be formed on the substrate 64. All the wiring patterns (first to third wiring patterns 10, 20, and 60, for example) may be pulled out toward one side of the substrate 64. In this case, an area of the electronic device 1 for mounting another electronic component (circuit board 100) is located on one side of the electronic device 1.

The conductive section 70 is electrically connected with the first wiring pattern 10. For example, the conductive section 70 may be formed on the first wiring pattern 10. Connection resistance between the conductive section 70 and the first wiring pattern 10 can be adjusted by a material for the first wiring pattern 10 in the area in contact with the conductive section 70. For example, a surface layer for a plurality of layers which make up the first wiring pattern 10 may be formed of the same material as the second electrodes 52 (ITO, for example), as shown in FIG. 3.

The conductive section 70 is formed at a position higher than the substrate. The conductive section 70 is formed to surround the operating region 54 from three directions. The conductive section 70 is disposed on the side opposite to the operating region 54 with the second wiring pattern 20 interposed therebetween. The conductive section 70 is formed longer than one side of the operating region 54. The details described for the first wiring pattern 10 are applied to the conductive section 70. The conductive section 70 is provided in a region in which the first wiring pattern 10 overlaps a first electrode 72. The conductive section 70 electrically connects the first wiring pattern 10 with the first electrode 72.

The first electrode 72 is electrically connected with the conductive section 70. The first electrode 72 is formed in a layer differing from the first wiring pattern 10. The first electrode 72 has an area which overlaps the first wiring pattern 10. The first electrode 72 supplies electrical energy to a plurality of the operating elements 50 in common. Since the conductive section 70 is formed with a large length (large size), the first wiring pattern 10 can be electrically connected with first electrode 72 while decreasing the resistance. The conductive section 70 and the first electrode 72 may be integrally formed of a single material. Part of the first electrode 72 overlaps the operating elements 50. Energy (current or voltage, for example) can be supplied to the operating elements 50 from the first and second electrodes 72 and 52. The first electrode 72 is located at a position higher than the second electrodes 52. The first and second electrodes 72 and 52 may face each other at least in part. The first and second electrodes 72 and 52 sandwich the operating elements 50 at least in part. The first electrode 72 may cover the first and second wiring patterns 10 and 20.

The first electrode 72 is supported by an insulating layer 74. The insulating layer 74 may seal the operating elements 50. The insulating layer 74 is provided between the first wiring pattern 10 and the first electrode 72 in the area excluding the conductive section 70. The insulating layer 74 is formed on the first and second wiring patterns 10 and 20, the electronic circuit 56, and the like. Openings are formed in the insulating layer 74 in the area necessary for electrical connection. For example, a groove which passes through the insulating layer 74 is formed on the first wiring pattern 10 along the direction in which the first wiring pattern 10 extends. The conductive section 70 is formed in the groove. Through holes are formed on the operating elements 50, and the first electrode 72 and each of the operating elements 50 are electrically connected through the through holes. As a modification example, the first electrode 72 may be supported by the substrate.

At least one or a plurality of electronic components 101 to 105 are mounted on the circuit board 100. A circuit for driving an organic EL panel is formed by the electronic components 101 to 105, for example. The circuit board 100 is installed in the electronic device 1. An interconnection pattern (a plurality of wiring patterns) 106 is formed on the circuit board 100 (an the back face in FIG. 1). The ends of the interconnection pattern (a plurality of wiring patterns) 106 are electrically connected with the terminals 14 and 62 and the like of the electronic device 1. An anisotropic conductive film (ACF), an anisotropic conductive paste (ACP), or the like may be used to electrically connect the interconnection pattern 106 with the terminals.

The first and second wiring patterns 10 and 20 of the electronic device 1 are electrically connected with power supply circuits included in the electronic components 101 and 105, for example. Current is supplied to the operating elements 50 from the first and second electrodes 72 and 52 through the first and second wiring patterns 10 and 20. In this embodiment, the first electrode 72 is a cathode. However, the second electrode 52 may be a cathode. One group of the third wiring patterns 60 electrically connected with the electronic circuit 56 of the electronic device 1 is electrically connected with timing signal generating circuits included in the electronic components 102 and 104, for example. Another group of the third wiring patterns 60 electrically connected with the electronic circuit 56 of the electronic device 1 is electrically connected with power supply circuits included in the electronic components 101 and 105, for example. Another group of the third wiring patterns 60 electrically connected with the second electrodes 52 is electrically connected with an image signal output circuit included in the electronic component 103, for example.

The electronic device according to this embodiment has the above-described configuration. The operation of the electronic device is described below. As described above, light-emitting materials are provided to the operating elements 50, and current is supplied to the operating elements 50. Current is supplied from the first and second wiring patterns 10 and 20. For example, the first split wiring pattern 11 of the second wiring pattern 20 which is wider than the second and third split wiring patterns 12 and 13 supplies heavy current (or stable current) to a material exhibiting poor light-emitting efficiency (polymer material (blue light-emitting material, for example)). The second and third split wiring patterns 12 and 13 supply current to low-molecular-weight materials. (red and green light-emitting materials, for example). Light produced in the operating elements 50 is transmitted through the substrate 64, as shown in FIG. 3. This enables an image or the like to be displayed from the side of the substrate 64. In this embodiment, the first wiring pattern 10 is a cathode. Control of current and selection of pixels from which light is emitted are performed by the image signal output circuit, the timing signal generating circuit, the electronic circuit 56 (scanning driver), and the like.

Figure 4:
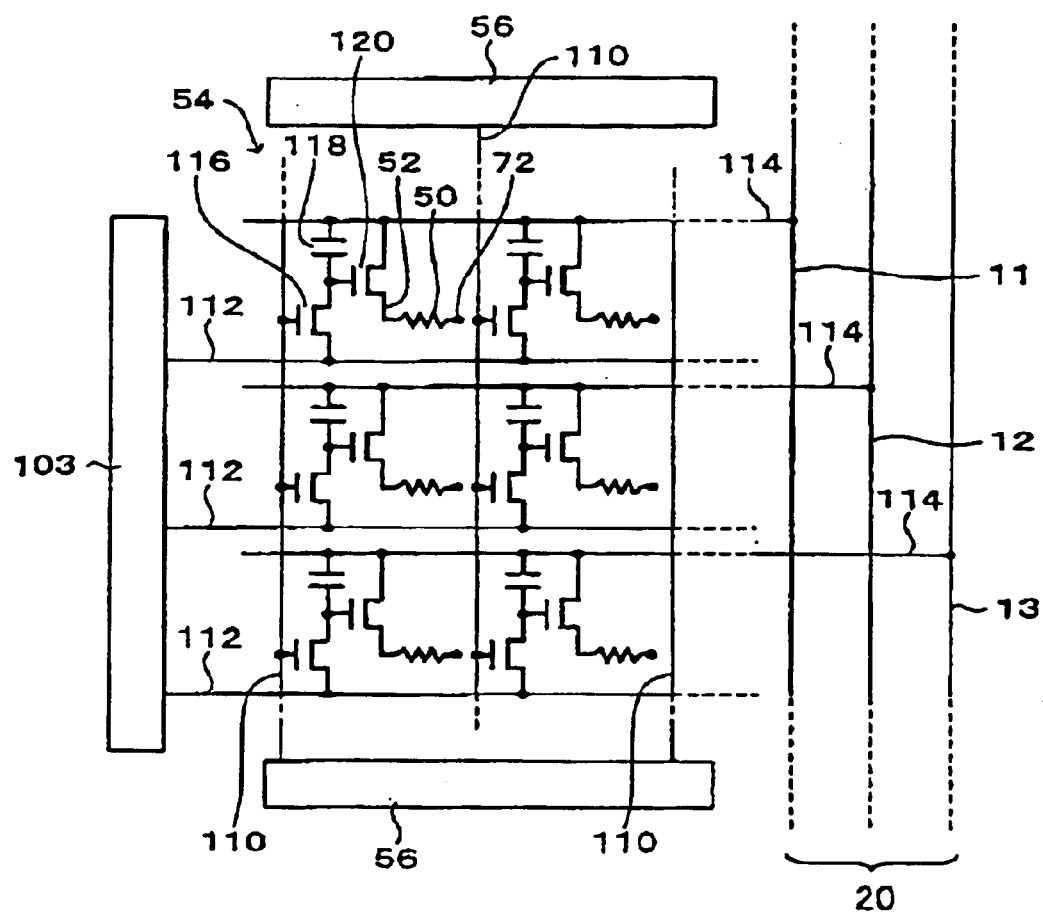
FIG. 4 is a circuitry diagram of an electronic device according to one embodiment of the present invention.

FIG. 4 is a view illustrating a circuitry of an electronic device according to one embodiment of the present invention. This circuit is a circuit of an active matrix type display device utilizing organic EL elements. A plurality of scanning lines 110, a plurality of signal lines 112 extending in a direction which intersects the scanning lines 110, and a plurality of common power supply lines 114 extending along the signal lines 112 are formed in the operating region 54 (display section). The scanning lines 110 are electrically connected with a scanning line driver (which includes shift registers and level shifters, for example) of the electronic circuit 56. The signal lines 112 are electrically connected with a signal line driver (which includes shift registers, level shifters, video lines, and analog switches, for example) of the electronic component 103. The common power supply line 114 is electrically connected with the second wiring pattern 20 (one of first to third split wiring patterns 11 to 13).

The operating elements 50 (pixels) are provided corresponding to each intersection point of the scanning lines 110 and the signal lines 112, switching elements 116 are electrically connected with the scanning lines 110 corresponding to each pixel. In the case where the switching element 116 is a thin film transistor (MOSFET), the scanning line 110 is electrically connected with a gate electrode of the switching element 116. Capacitors 118 are electrically connected with the signal lines 112 corresponding to each pixel. In more detail, the capacitor 118 is electrically connected between the signal line 112 and the common power supply line 114, and is capable of retaining charges corresponding to the image signal from the signal line 112. The switching element 116 is electrically connected between the capacitor 119 and the signal line 112. The switching element 116 is controlled by a scanning signal from the scanning line 110. The switching element 116 controls charge storage in the capacitor 118.

The drive element 120 is controlled by the amount of charge or the presence or absence of charge retained in the capacitor 118. In the case where the drive element 120 is a thin film transistor (MOSFET), a gate electrode of the drive element 120 and an electrode of the capacitor 118 on the side of the signal line 112 are electrically connected. The drive element 120 is electrically connected between the common power supply line 114 and the operating element 50. Specifically, the drive element 120 controls supply of current from the common power supply line 114 to the operating element 50.

When the switching element 116 is turned ON by the scanning signal of the scanning line 110, charges are retained in the capacitor 118 by the potential difference between the signal line 112 and the common power supply line 114. The control state of the drive element 120 is determined depending on the charge retained in the capacitor 118. Current flows into the second electrode 52 from the common power supply line 114 through a channel of the drive element 120, and current flows into the first electrode 72 through the operating element 50. The operating element 50 emits light corresponding to the amount of current flowing through the operating element 50. Specifically, the operating element 50 is driven by a driver circuit (circuit including the drive elements 120). The driver circuit is electrically connected with the second electrodes 52. The driver circuit is electrically connected with the second wiring pattern 20.

A method of manufacturing an electronic device according to this embodiment is described below. The method of manufacturing the electronic device comprises forming the first and second wiring patterns 10 and 20, the first and second electrodes 72 and 52, the conductive section 70, and the operating element 50. These members, may be stacked on the substrate 64. The conductive section 70 is disposed on the side opposite to the operating region 54 with the second wiring pattern 20 interposed therebetween. The conductive section 70 is formed with a length at least equal to one side of a region in which the operating element 50 is formed. According to the present embodiment, a large conductive section 70 disposed outside the second wiring pattern 20 can be formed. The conductive section 70 can be electrically connected with the first electrode 72 while decreasing the resistance by forming the conductive section 70 with a length at least equal to one side of the operating region 54.

Figure 5:
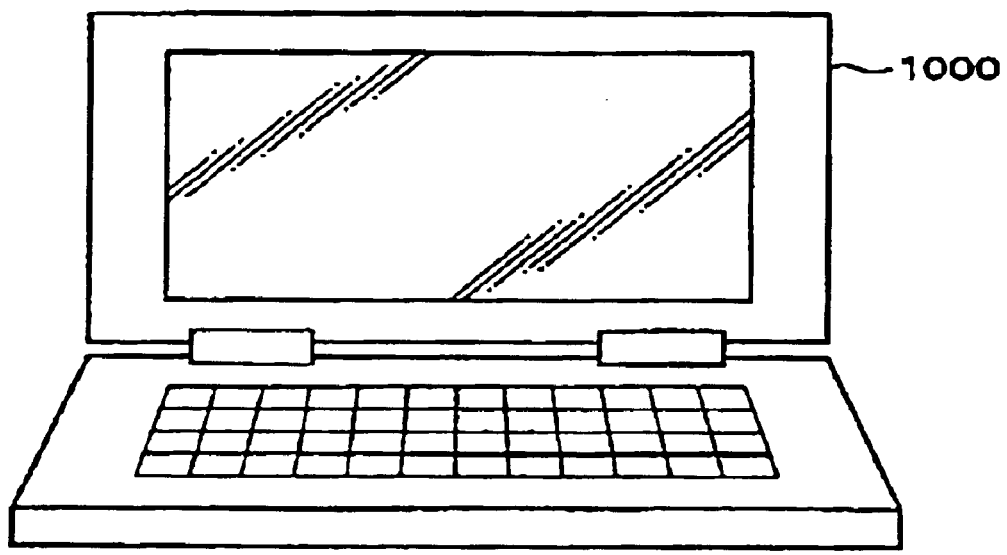
FIG. 5 is a schematic view showing an electronic instrument according to one embodiment of the present invention.
Figure 6:
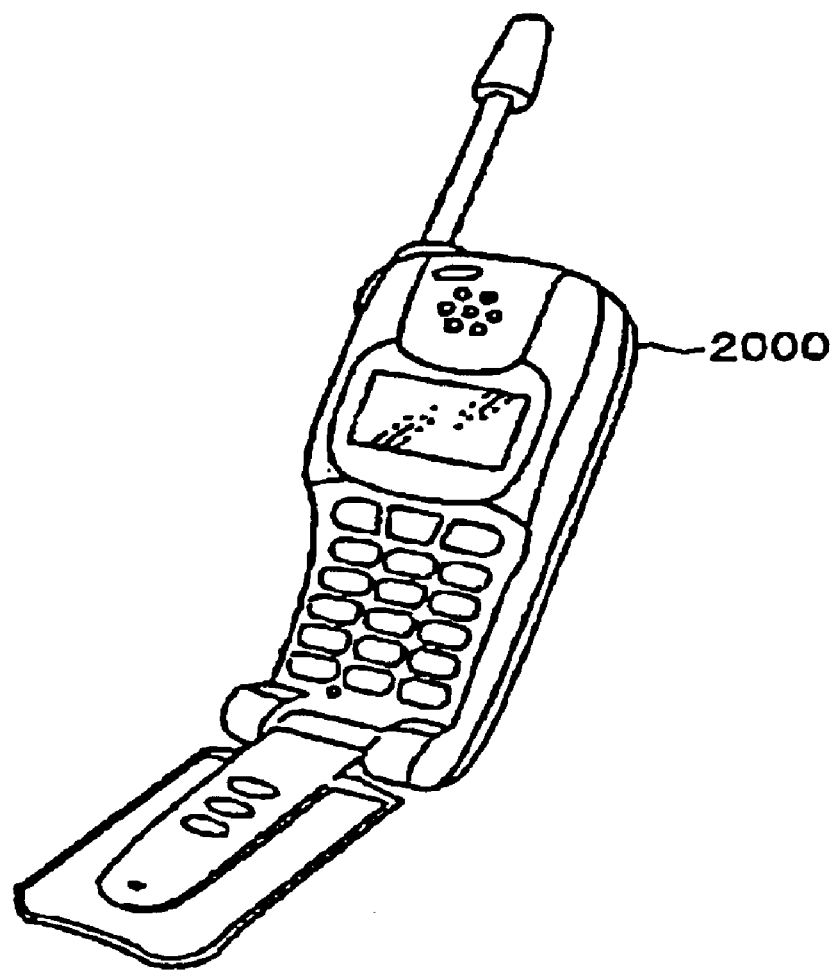
FIG. 6 is a schematic view showing another electronic instrument according to another embodiment of the present invention.

FIGS. 4 and 5 respectively show a notebook personal computer 1000 and a portable telephone 2000 as examples of electronic instruments including the electronic device according to one embodiment of the present invention.

The present invention is not limited to the above-described embodiments and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. An electronic device comprising:
   a substrate;
   a plurality of operating elements provided on the substrate and defining an operating region thereof;
   a first wiring pattern which is provided outside the operating region in the substrate and is longer than the width of the operating region;
   a first electrode, provided in a layer different from the first wiring pattern, partially overlapping the first wiring pattern, for supplying electrical energy commonly to the operating elements; and
   a conductive section, provided in a region in which the first wiring pattern partially overlaps the first electrode, for electrically connecting the first wiring pattern with the first electrode.

2. The electronic device according to claim 1, further comprising:
   second electrodes provided in accordance with the operating elements to supply the electrical energy to the operating elements;
   a plurality of driver circuits electrically connected with the second electrodes for driving the operating elements; and
   a second wiring pattern provided between the operating region and the first wiring pattern, and electrically connected to the driver circuits.

3. The electronic device according to claim 1, further comprising:
   an insulating layer provided in a region between the first wiring pattern and the first electrode but except the conductive section.

4. The electronic device according to claim 1,
   wherein the substrate has a plurality of sides and a plurality of terminals are provided in a region near one of the sides.

5. An electronic instrument comprising the electronic device according to claim 1.

6. The electronic device according to claim 2,
   wherein the first electrode faces the second electrodes, at least part of the operating elements being interposed between the first and second electrodes.

7. The electronic device according to claim 2,
   wherein the first wiring pattern surrounds the operating region with an opening through which a third wiring pattern electrically connected to the operating elements is provided.

8. The electronic device according to claim 2,
   wherein an electronic circuit for supplying a signal to the driver circuits is provided between the operating region and the first wiring pattern.

9. The electronic device according to claim 2, wherein the second wiring pattern includes a plurality of split wiring patterns which are separated from each other.

10. The electronic device according to claim 8, wherein the first wiring pattern surrounds the operating region and the electronic circuit with an opening through which a third wiring pattern electrically connected to at least one of the operating elements and the electronic circuits is provided.

11. The electronic device according to claim 7, further comprising:

a plurality of terminals in an end portion of the substrate to which the first, second, and third wiring patterns are electrically connected, wherein a first group of the terminals to which the first and second wiring patterns are electrically connected is formed at a pitch larger than a pitch of a second group of the terminals to which the third wiring pattern is electrically connected.

12. The electronic device according to claim 9, wherein:

each of the operating elements has one of light-emitting materials which emit different colors of light from each other; and the split wiring patterns are provided in accordance with the colors of light.

13. The electronic device according to claim 9, wherein part of at least one of the split wiring patterns and part of the other split wiring patterns are disposed on the opposite sides of the operating region.

14. The electronic device according to claim 9, wherein:

at least two of the split wiring patterns have portions adjacent to each other between the operating region and an edge portion of the substrate; and at least the portions of the split wiring patterns adjacent to each other have different widths.

15. The electronic device according to claim 9, wherein at least one of the split wiring patterns has a first section which is adjacent to another one of the split wiring patterns between the operating region and an edge portion of the substrate, and a second section which is wider than the first section.

16. The electronic device according to claim 10, wherein:

the electronic circuit includes a scanning line driver; and the third wiring pattern includes an wiring pattern which supplies a data signal to the driver circuits.

17. The electronic device according to claim 10, further comprising:

a plurality of terminals provided in an end portion of the substrate to which the first, second, and third wiring patterns are electrically connected, wherein a first group of the terminals to which the first and second wiring patterns are electrically connected is formed at a pitch larger than a pitch of a second group of the terminals to which the third wiring pattern is electrically connected.

18. A method of manufacturing an electronic device comprising:

forming a plurality of operating elements to define an operating region of a substrate;

forming a first wiring pattern which is longer than the operating region outside the operating region;

forming a conductive section on the first wiring pattern; and forming a first electrode for supplying electrical energy commonly to the operating elements in a layer different from the first wiring pattern so that the first electrode covers the conductive section and partially overlaps the first wiring pattern.

19. The method of manufacturing an electronic device according to claim 18, further comprising:

providing second electrodes in accordance with the operating elements to supply the electrical energy to the operating elements;

forming a plurality of driver circuits for driving the operating elements to be electrically connected to the second electrodes; and forming a second wiring pattern between the operating region and the first wiring pattern to be electrically connected to the driver circuits.

20. The method of manufacturing an electronic device according to claim 19, comprising:

providing to each of the operating elements with one of a plurality of light-emitting materials which emit different colors of light from each other; and forming a plurality of split wiring patterns separated from each other in accordance with the colors of light.

21. The method of manufacturing an electronic device according to claim 20, wherein:

forming at least two of the split wiring patterns so as to have portions partially adjacent to each other between the operating region and an edge of the substrate; and forming at least the portions of the split wiring patterns adjacent to each other so as to have different widths from each other.

* * * * *